April 11, 1961 B. CORNELISON ET AL 2,979,429
DIFFUSED TRANSISTOR AND METHOD OF MAKING
Filed July 9, 1958
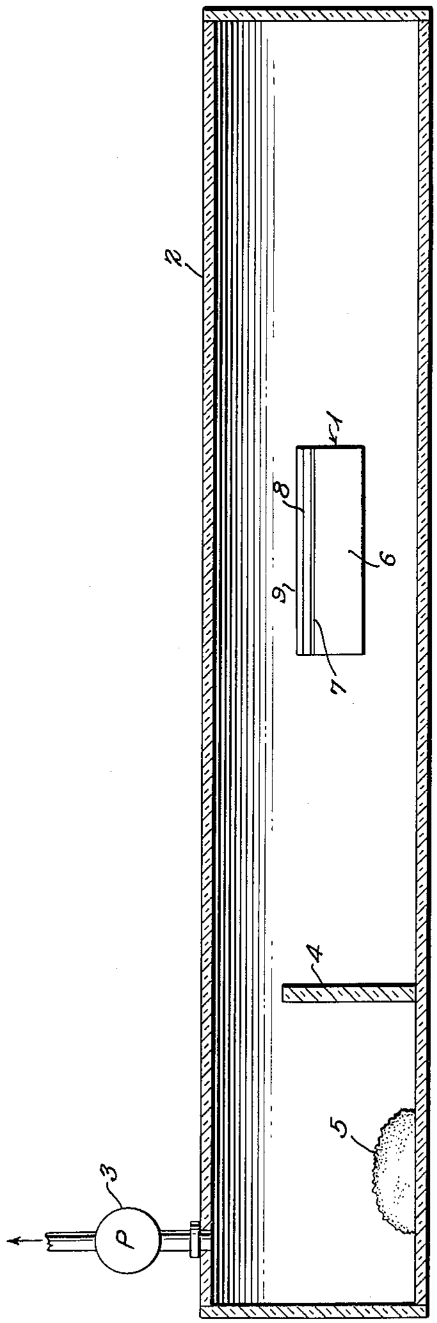
INVENTORS
Boyd Cornelison and
Elmer A. Wolff, Jr.
BY Stevens, Davis, Miller & Mosher
ATTORNEYS United States Patent Office 2,979,429 Patented Apr. 11, 1961

2,979,429

DIFFUSED TRANSISTOR AND METHOD OF MAKING

Boyd Cornelison, Dallas, and Elmer A. Wolff, Jr., Richardson, Tex., assignors to Texas Instruments Incorporated, Dallas, Tex., a corporation of Delaware Filed July 9, 1958, Ser. No. 747,457

5 Claims. (Cl. 148—1.5)

The present invention relates to the fabrication of a semiconductor signal translating device and more particularly to a method of making a diffused junction transistor which is specially characterized by an intrinsic layer.

The art of making p-n junctions using diffusion techniques has advanced to the stage where two impurities of opposite conductivity producing types can be simultaneously diffused from the vapor state into a body of semiconductor material having an initial conductivity to produce a pair of p-n junctions.

It is a broad object of the present invention to further advance the art of producing p-n junctions using diffusion techniques by providing a method of fabricating a junction transistor which results in the formation of an intrinsic layer. This is essentially accomplished by a differential diffusion technique utilizing a plurality of N- and P-type impurities.

It is recognized that to convert a region of a semiconductive body of one conductivity type to an intrinsic region, it is necessary to change the resistivity of the material from its original value, usually less than 5 ohm centimeters, to above about 60 ohm centimeters. Such a resistivity change may be effected in either of one of two ways. The impurity concentration must be substantially decreased or a number of carriers of a conductivity producing type opposite to that initially possessed by the region must be added to neutralize the effects of the conductivity producing impurities originally in this region.

In accordance with the present invention, a single step diffusion technique of impurities from the vapor state is employed wherein three impurities of predetermined conductivity producing types are introduced into a body of semiconductor material. Each impurity has a different diffusion coefficient so that the resulting product is either a PNIP or an NPIN transistor. In each case, the intrinsic layer is the innermost diffused layer and is obtained by neutralizing the effects of the impurities originally in this layer. Since the intrinsic layer is the innermost diffused layer, the impurity which is introduced into this layer must have the highest diffusion coefficient of all the impurities being introduced into the semi-conductor body. In addition, the quantity of the impurity material must be carefully controlled so that the concentration of this impurity in the intrinsic region just balances the impurity carriers originally in this region and does not overbalance them. The impurity material employed in accordance with the present invention which is introduced into the next most inner diffused layer must be of a type and be used in sufficient quantity to convert the region into which it diffuses into opposite type conductivity. The impurity material introduced into the outer diffused layer must be of a type and be used in sufficient quantity to overcome the effects of the two aforementioned impurities and reconvert the surface layer of the body back to its original type conductivity.

The discussion thus far has proceeded with reference to the formation of an NPIN transistor and a PNIP transistor. The invention, however, is not limited to only NPIN or PNIP transistors since by properly selecting various of the impurity materials with regard to kind, quantity and their diffusion coefficients, numerous layers may be formed in a body of semiconductor material by a single step process of diffusing the selected impurities from the vapor state into the body.

As in all vapor diffusion processes, the quantities of the materials used must be carefully controlled in regard to one another so that no material under the given operating conditions will saturate the surface of the semiconductor beyond its limit of solubility and thereby exclude or inhibit the diffusion of a proper quantity of each material into the body of semiconductor material.

The equation that describes the concentration of impurity carriers at any depth below the surface of a semiconductor body is as follows:

$$C_x = C_0\left(1 - \operatorname{erf}\frac{x}{2\sqrt{Dt}}\right)$$

wherein $C(x)$ is the concentrations of the carriers in atoms per cubic centimeters at any depth $x$; $C_0$ is the concentration in atoms per cubic centimeter at the surface of the wafer; $x$ is any depth in centimeters; D is the diffusion coefficient of the material and $t$ is the time of treatment. There are three independent variables in this equation, these being the terms D, $C_0$ and time. Both D and $C_0$ are dependent upon the temperature of treatment. Therefore, in the present invention, the temperature must be chosen with due regard to the desired combination of diffusants to produce the final desired results.

In one embodiment of the present invention, a wafer of germanium of N-conductivity type and having a resistivity of about 3 ohm centimeters is used. The impurities employed in this example are indium, gallium and arsenic. Of the impurities, gallium has the highest diffusion coefficient and is employed in sufficient quantity to penetrate the deepest and to produce a clearly defined intrinsic layer. The indium has the second highest diffusion coefficient and is employed to produce a P-layer contiguous to the intrinsic layer. The arsenic is employed to produce an N-type layer at the surface of the wafer contiguous to the P-conductivity layer.

The invention and the above-noted and other features thereof will be understood more clearly and fully from the following detailed description with reference to the accompanying drawing in which the single figure of the accompanying drawing is a schematic illustration of the type of apparatus employed and the resulting product.

Referring specifically to the figure, a wafer 1 of N-type germanium having a resistivity of about 3 ohm centimeters is placed in a standard reaction chamber 2 which may be a quartz tube. Chamber 2 is connected to be evacuated by a pump 3. The wafer is placed as viewed in the figure to the right of a baffle or wall 4, and the impurity materials to be employed in the process are mixed together in the form of a mass 5 and placed on the left-hand side of the wall 4. After the chamber 2 has been evacuated to the desired extent by the pump 3, the chamber is heated by suitable means until the mass 5 becomes vaporized. The temperature and times employed for treatment are chosen in accordance with the above equation. At the end of the desired reaction time, the reaction tube 2 is cooled and then the wafer is removed. The wafer 1 now comprises a collector region 6 having the original conductivity of the wafer which is indicated in this instance to be N-type conductivity. Immediately overlying the collector region 6 is an intrinsic layer 7. The inner boundary of this layer only lies a short distance below the surface of the wafer and, in fact, in the specific example, lies only 0.0003 inch into the wafer 1. The intrinsic layer 7 has a resistivity above about 60 ohm centimeters. Immediately overlying the intrinsic layer 7 is a layer 8 of P-type conductivity which, in a specific example, may have an inner boundary about 0.00015 inch from the surface of the wafer and an outer boundary a distance of 0.0001 inch from the surface of the wafer. Above the layer 8 and at the upper surface of the wafer 1 is a layer 9 of N-conductivity material. By virtue of the above described method, the semiconductive body, wafer 1, is transformed into an NPIN transistor.

In a specific example of a method for forming an NPIN transistor, a semiconductive body of N-type conductivity germanium is placed in a quartz tube with three impurities and the tube is evacuated to a pressure of 75 microns. The three impurity materials employed in this particular process and their relative quantities are indium 200 milligrams, arsenic 3 milligrams, and gallium which is added as a gallium-indium alloy with gallium constituting $1/10$ of 1% of 10 milligrams of the alloy.

In this arrangement, gallium has the highest diffusion coefficient and is employed to form the intrinsic layer 7. The indium is employed to form the P-type layer 8 whereas the arsenic is employed to form the upper N-layer 9. After the materials have been sealed in the tube and the tube has been evacuated to 75 microns pressure as indicated above, the tube is heated to a temperature of from 900° C. to 1200° C. for five hours to one hour, respectively. At the end of the treatment, the tube is cooled and fabrication of the semiconductive body is completed by lapping away unwanted portions and attaching suitable contacts in accordance with accepted practice.

An analysis of the final product indicates that the intrinsic layer 7 contains gallium and the initial N-type impurity in the wafer. The layer 7, in this example, was changed from a resistivity of 3 ohm centimeters to 100 ohm centimeters. The P-type layer 8 includes gallium, indium and the original N-type impurity, whereas the external layer 9 includes gallium, indium, arsenic and the original N-type impurity. The gallium in the intrinsic layer is there on an atomic basis in substantially the same quantity as the original N-type impurity, while in the P-type layer, the indium predominates. In the outer N-type layer, of course, the arsenic predominates.

Although the preceding discussion of the invention is largely confined to a single preferred embodiment, it will be appreciated that obvious changes or substitutions are considered within the purview of the invention. For example, any suitable semiconductor material can be used including germanium, silicon, and combinations of two or more elements; any suitable impurity materials can be used; and any permissible variations can be made in the operating conditions of the process.

What is claimed is:

1. The method of fabricating a semiconductive body having a plurality of layers of different conductivities and at least one layer of intrinsic conductivity comprising placing a body of semiconductive material of an N-type conductivity in a chamber evacuating air from the chamber, subjecting the body simultaneously to the vapor of the elements gallium, indium and arsenic at a temperature and for a time sufficient to produce diffusion of said elements into said body.

2. The method of fabricating a semiconductive body having a plurality of layers of different conductivities and at least one layer of intrinsic conductivity comprising placing a body of semiconductive material of an N-type conductivity in a chamber evacuating air from the chamber, and subjecting the body simultaneously to the vapor of the elements gallium, indium and arsenic at a temperature of from 900° C. to 1200° C. for from five hours to one hour, respectively.

3. The method of fabricating a semiconductive body having a plurality of layers diffused therein with the innermost diffused layer of intrinsic conductivity comprising placing a body of semiconductive material of a first conductivity type in a chamber, and heating body in the presence of vapors of at least three impurity materials having substantially different diffusion coefficients at a temperature and for a time sufficient to diffuse said impurity materials into said body, at least two of said impurity materials being of opposite conductivity producing type, and at least one of said impurity materials being of said first conductivity producing type, said impurity materials of opposite conductivity producing type having higher diffusion coefficients than said impurity material of said first conductivity producing type, the faster diffusing of said impurity materials of said opposite conductivity producing type being present in sufficient concentration to produce said layer of intrinsic conductivity.

4. The method of claim 3 wherein said semiconductive material is germanium.

5. The method of claim 3 wherein said semiconductive material is silicon.

References Cited in the file of this patent

UNITED STATES PATENTS 2,861,018 Fuller et al. ............ Nov. 18, 1958